United States Patent
Watanabe

(10) Patent No.: US 8,098,847 B2
(45) Date of Patent: Jan. 17, 2012

(54) MUTING CIRCUIT

(75) Inventor: Akio Watanabe, Tamamura-machi (JP)

(73) Assignees: Semiconductor Components Industries, LLC, Phoenix, AZ (US); Sanyo Semiconductor Co., Ltd., Gunma (JP)

( * ) Notice: Subject to any disclaimer, the term of this patent is extended or adjusted under 35 U.S.C. 154(b) by 1153 days.

(21) Appl. No.: 11/858,848

(22) Filed: Sep. 20, 2007

(65) Prior Publication Data

US 2008/0075301 A1   Mar. 27, 2008

(30) Foreign Application Priority Data

Sep. 21, 2006  (JP) ................... 2006-256163

(51) Int. Cl.
*H04B 15/00* (2006.01)
(52) U.S. Cl. ...................................... 381/94.5
(58) Field of Classification Search .............. 381/94.5, 381/109, 123; 330/51, 278
See application file for complete search history.

(56) References Cited

U.S. PATENT DOCUMENTS

| | | | |
|---|---|---|---|
| 6,734,746 B1 * | 5/2004 | Nogi | 331/81 |
| 2007/0127742 A1 * | 6/2007 | Seven | 381/111 |

FOREIGN PATENT DOCUMENTS

| | | |
|---|---|---|
| JP | 11-327579 | 11/1999 |
| KR | 1999-84329 | 12/1999 |
| KR | 10-2004-14819 | 2/2004 |

OTHER PUBLICATIONS

KR Intellectual Property Office, Notification of Submission of Opinions dated Dec. 8, 2008, in KR Appln. No. 10-2007-95290. English translation.

* cited by examiner

*Primary Examiner* — Vivian Chin
*Assistant Examiner* — Kile Blair
(74) *Attorney, Agent, or Firm* — SoCal IP Law Group LLP; Steven C. Sereboff; John E. Gunther

(57) ABSTRACT

A muting circuit comprising: a DC offset eliminating unit including an HPF (High Pass Filter) constituted by a first operational amplifier to eliminate a DC offset component of an AC input signal, the DC offset eliminating unit being configured to output an output signal obtained by eliminating the DC offset component of the AC input signal; a muting signal generating unit including a second operational amplifier configured to generate a second DC offset identical in level to a first DC offset at the first operational amplifier, the muting signal generating unit being configured to output a muting signal indicative of the second DC offset by fixing input to the second operational amplifier at a predetermined DC level; and a selecting unit configured to select and output the output signal when muting is not executed, and to select and output the muting signal when muting is executed.

4 Claims, 6 Drawing Sheets

MUTING CIRCUIT

CROSS-REFERENCE TO RELATED APPLICATION

This application claims the benefit of priority to Japanese Patent Application No. 2006-256163, filed Sep. 21, 2006, of which full contents are incorporated herein by reference.

BACKGROUND OF THE INVENTION

1. Field of the Invention

The present invention relates to a muting circuit.

2. Description of the Related Art

An electronic volume that electronically controls the volume of speakers is typically provided with a muting circuit that produces no-sound condition (mute) by temporarily cutting off an audio signal when the noise superimposed upon the audio signal is detected or when a mute button is pressed. The pitch and the volume of an audio signal are known to have characteristics to be adjusted by frequency control and by amplitude control, respectively. With the application of such the characteristics of an audio signal, a muting circuit executes a process to produce no-sound condition (hereinafter, referred to as a muting process) by fixing a DC level at a predetermined level to eliminate the amplitude of the audio signal (see FIG. 4). As the predetermined DC level, "AC-GND" in an electronic volume is generally employed. The AC-GND means a GND applied for an AC signal that indicates a constant DC level as the amplitude center of an AC signal waveform.

FIG. 5 is a schematic illustrating the configuration of an electronic volume 10 equipped with a conventional muting circuit 30. As shown in the figure, the electronic volume 10 is composed mainly of an attenuation amount control circuit 20 that controls the attenuation amount of an AC input signal IN (audio signal) for volume control, and a muting circuit 30, that is equipped with analogue switches SW1 and SW2 that are switched on and off complimentarily by the electronic control of a microcomputer (not shown), that executes the muting process for the AC input signal IN after attenuation amount control (see, e.g., Japanese Patent Application Laid-Open Publication No. 1999-327579).

In normal state where muting process is not executed, the muting circuit 30 outputs the attenuation amount-controlled AC input signal IN as is as an AC output signal OUT by switching the analogue switches SW1 on and SW2 off. Here, the amplitude center of the AC input signal IN is to indicate a constant DC level Va. On the other hand, when muting process is executed, the muting circuit 30 outputs an AC-GND level Vb by switching the analogue switches SW1 off and SW2 on (see sections a and b of FIG. 6). Consequently, no-sound condition can be produced since the DC level of the AC output signal OUT is fixed at the AC-GND level Vb.

In the case of a conventional muting circuit such as the muting circuit 30 shown in FIG. 5, an AC input signal IN without muting process contains a DC offset Vx, that is a difference voltage between the AC-GND level Vb, due to the internal circuit characteristics of the electronic volume 10 and/or due to the manufacturing variation of ICs that compose the attenuation amount control circuit 20. The DC voltage of an AC output signal OUT is fluctuated by the DC offset Vx when the analogue switches SW1 and SW2 are switched-over between on and off, and noise is generated by such DC voltage fluctuations.

In the ideal state of an AC output signal OUT as shown in section c of FIG. 6, where a DC voltage fluctuation is induced momentarily at the start or the end of muting, the noise generated by the DC voltage fluctuation becomes a sound out of the audible frequency range, and therefore, the sound is harmless in being inaudible to humans, and thus it is not problematic. However, as an AC output signal OUT fluctuates slowly at the start or the end of muting as shown in section d of FIG. 6 due to the internal circuit characteristics of the electronic volume 10 and/or due to the manufacturing variation of ICs, this has been problematic, generating abrasive noise within the audible frequency range.

SUMMARY OF THE INVENTION

A muting circuit according to an aspect of the present invention, comprises: a DC offset eliminating unit including an HPF (High Pass Filter) constituted by a first operational amplifier to eliminate a DC offset component of an AC input signal, the DC offset eliminating unit being configured to output an output signal obtained by eliminating the DC offset component of the AC input signal; a muting signal generating unit including a second operational amplifier configured to generate a second DC offset identical in level to a first DC offset at the first operational amplifier, the muting signal generating unit being configured to output a muting signal indicative of the second DC offset by fixing input to the second operational amplifier at a predetermined DC level; and a selecting unit configured to select and output the output signal when muting is not executed, and to select and output the muting signal when muting is executed.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

<<Configuration/Operation of Audio Signal Processing System>>

Figure 1:
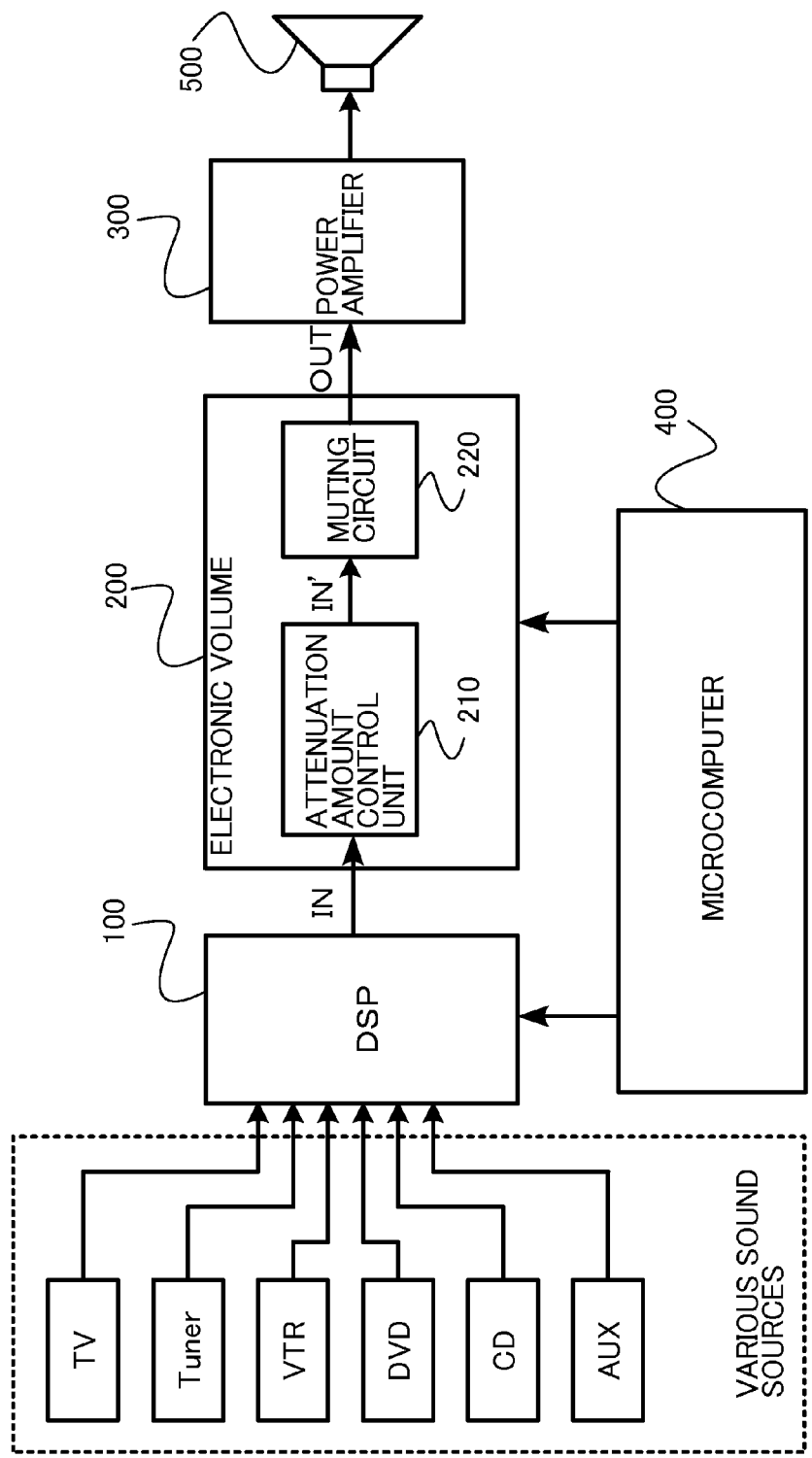
FIG. 1 is a schematic illustrating the configuration of an audio signal processing system according to an embodiment of the present invention.

FIG. 1 is a schematic illustrating the configuration of an audio signal processing system according to an embodiment of the present invention. For audio signals according to the present invention, sound signals from various sound sources such as a television, an AM/FM radio, a VTR (Video Tape Recorder), optical discs like a CD and a DVD, AUX (AUXiliary), etc. can be considered.

The audio signal processing system is composed of an acoustic DSP (Digital Signal Processor) 100 that executes a digital signal process, such as equalization and sound field correction, on digital audio signals from various sound sources, an electronic volume 200 that controls sound volume by the attenuation amount control of an analogue audio signal, that is D/A converted from the output of the DSP 100, a power amplifier 300 that drives a speaker 500 to output an analogue audio signal after volume-control by the electronic volume 200, and a microcomputer 400 for the integrated control of the entire system.

Here, the electronic volume 200 is equipped with an attenuation amount control unit 210 and a muting circuit 220, that are to be controlled by the microcomputer 400, and is a single chip of analogue/digital system-on-a-chip LSI, that is independent from the DSP 100.

The attenuation amount control unit 210 controls the attenuation amount of an AC input signal IN (analogue audio signal) for the purpose of sound volume control, that is a primary function of the electronic volume 200. For example, with the parallel arrangement of a plurality of pairs of analogue switch and feedback resistance (both are not shown) in the negative-feedback path of a negative-feedback amplifier, attenuation amount by the negative-feedback amplifier is controlled based on the value of combined feedback resistance by appropriately switching on and off the multiple analogue switches according to the sound volume indicated by the microcomputer 400.

The muting circuit 220 is a circuit to output an AC output signal that is obtained by muting an AC input signal IN' (AC input signal IN after attenuation amount control) by fixing its amplitude level at a DC level (for example, AC-GND level).

In addition to the system configuration shown in FIG. 1, the electronic volume 200 may be disposed before the DSP 100 for the system configuration to receive an analogue audio signal. It is also possible to integrate the function(s) of the electronic volume 200 (for example, attenuation amount control function), other than the muting circuit 220, as a part of the functions of the DSP 100.

<<Configuration/Operation of Muting Circuit>>

Figure 2:
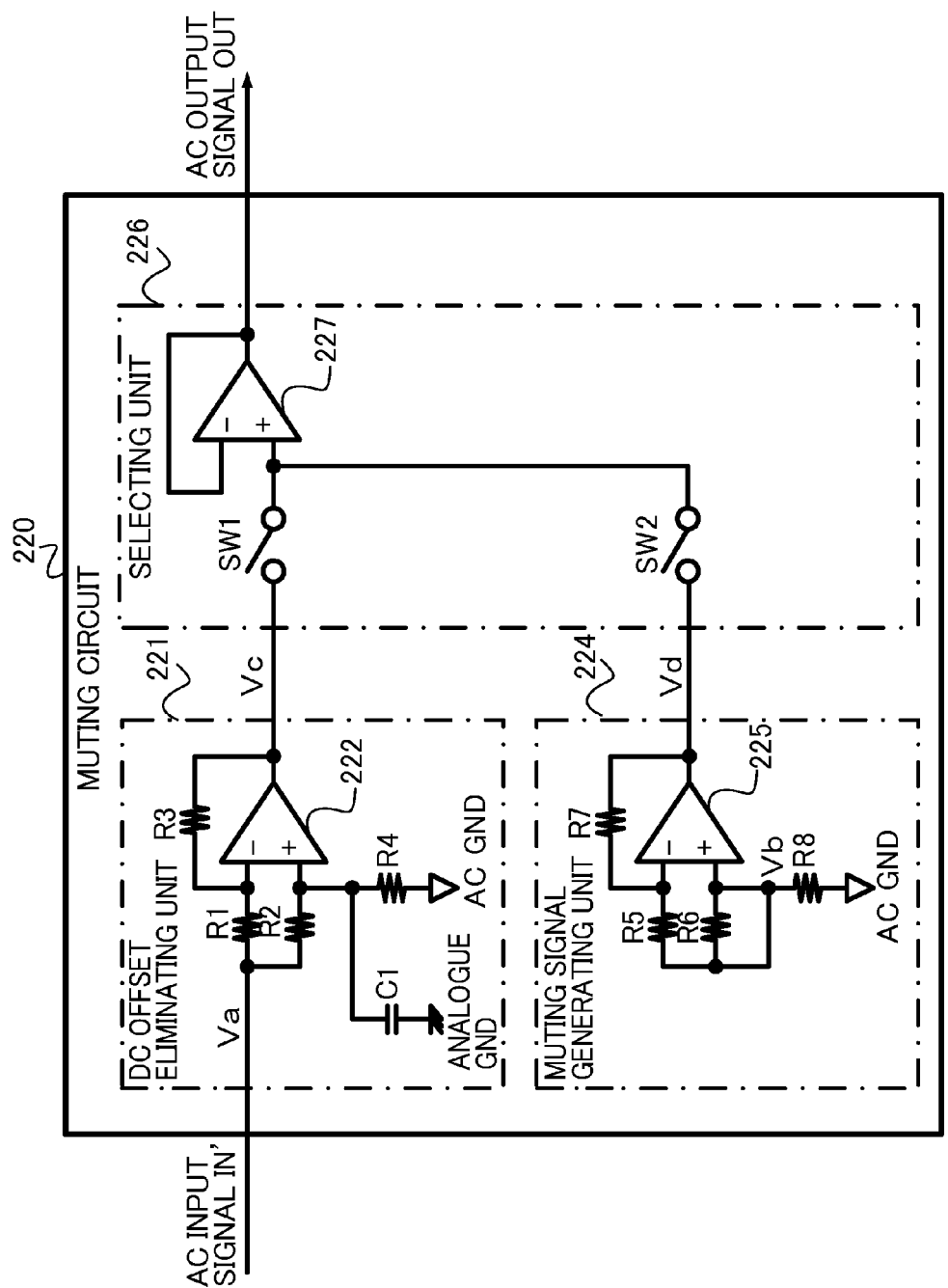
FIG. 2 is a schematic illustrating the configuration of a muting circuit according to an embodiment of the present invention.
Figure 3:
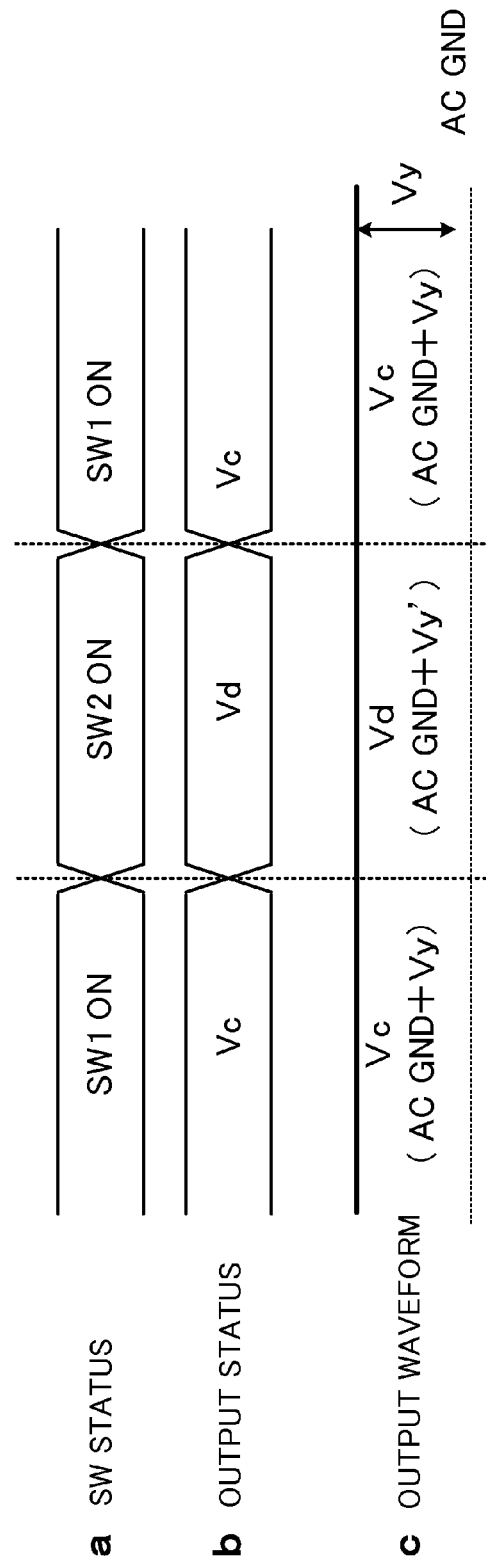
FIG. 3 is a schematic illustrating the principal state transition to explain the operation of a muting circuit according to an embodiment of the present invention.
Figure 4:
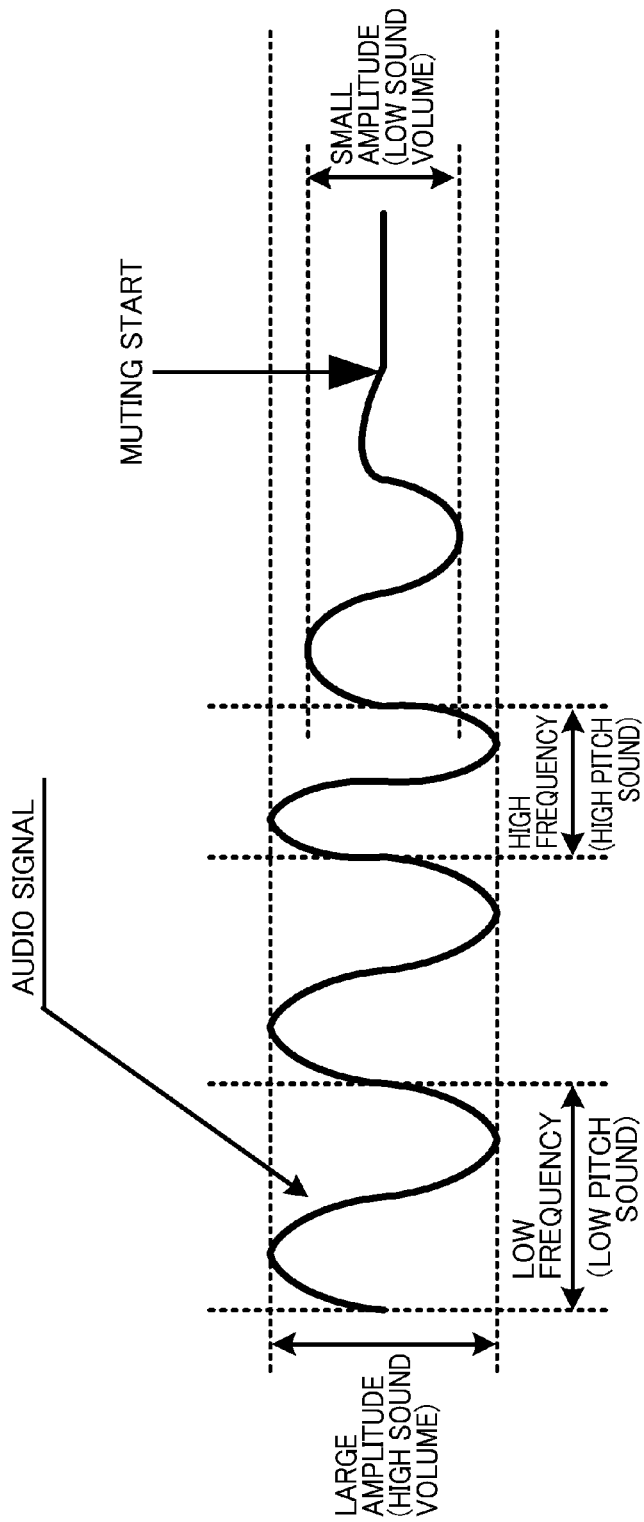
FIG. 4 is a schematic illustrating the mechanism of a muting process.
Figure 5:
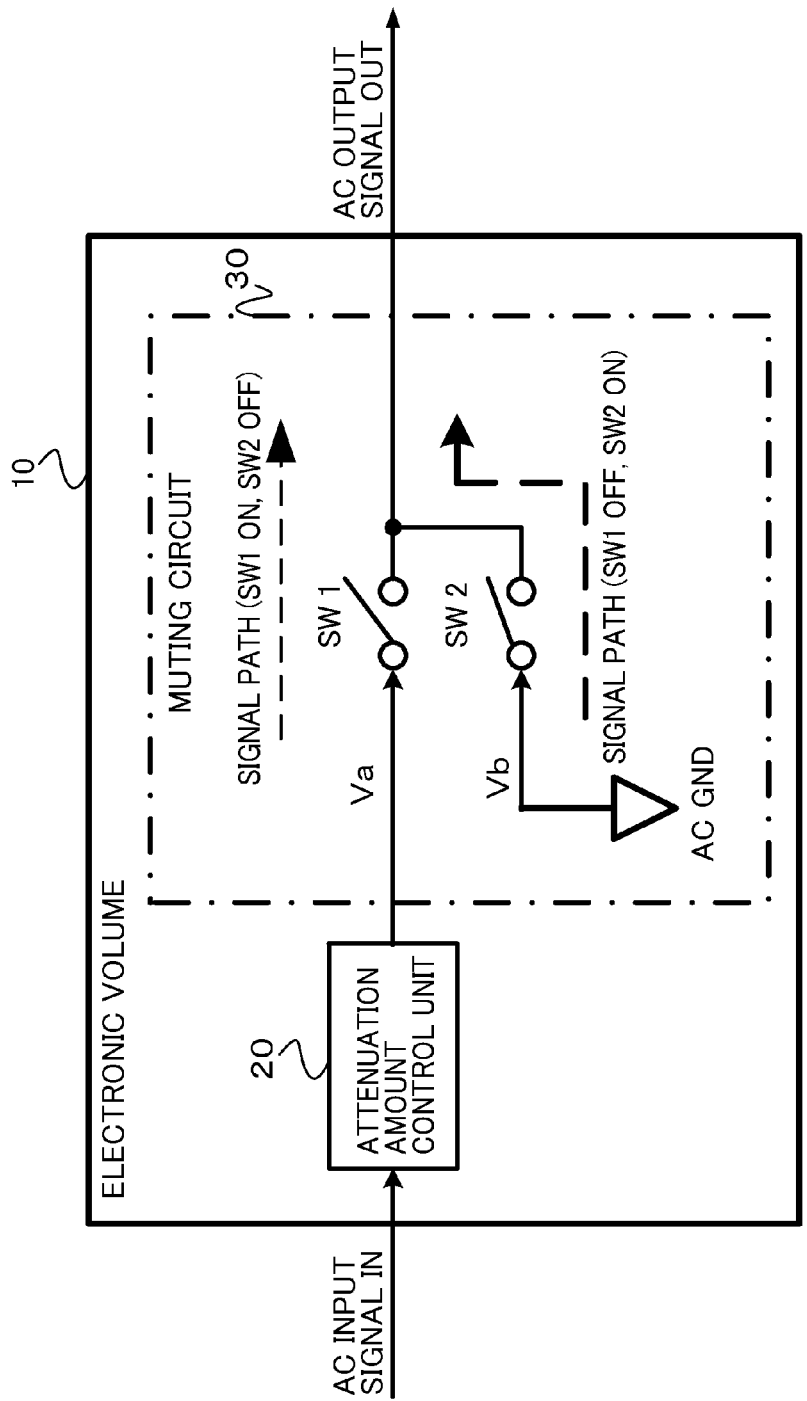
FIG. 5 is a schematic illustrating the mechanism of an electronic volume employing a conventional muting circuit.
Figure 6:
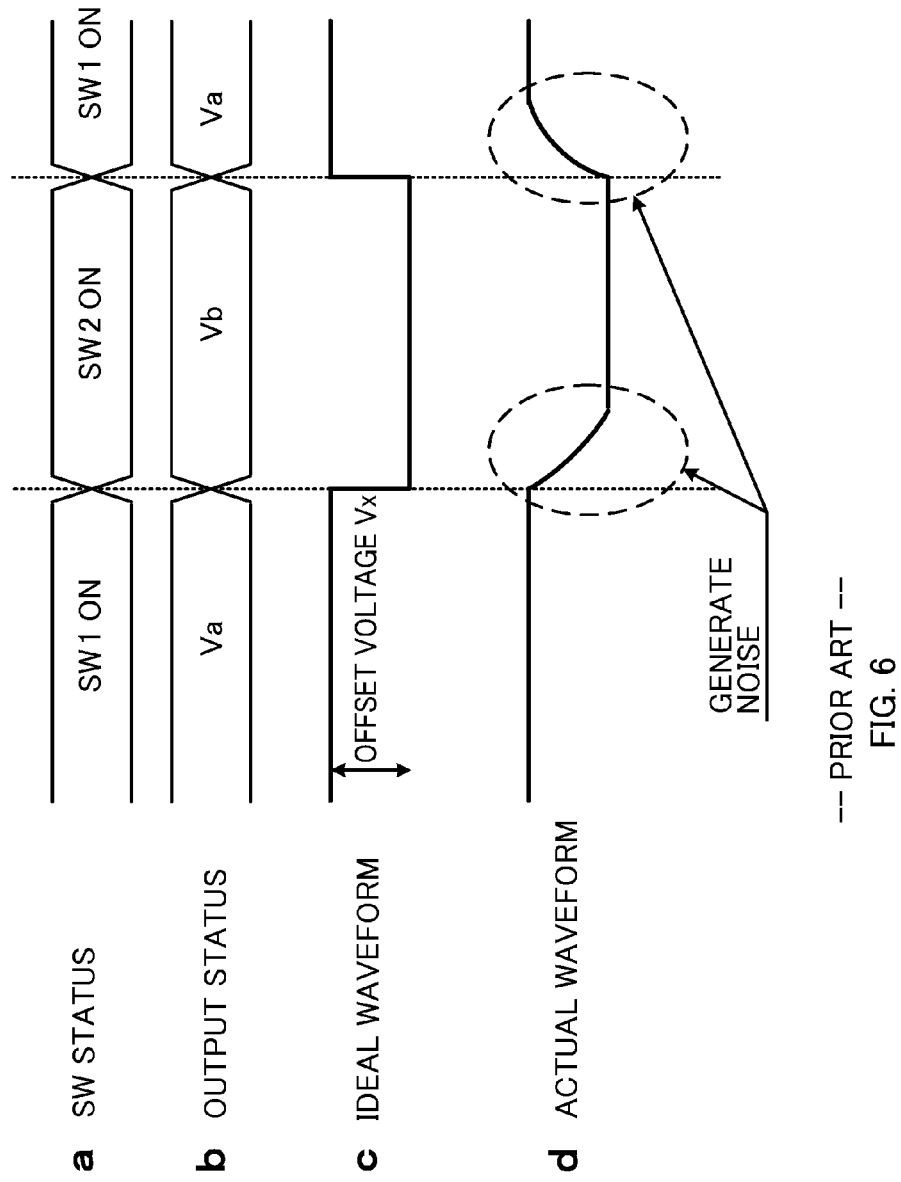
FIG. 6 is a schematic illustrating the principal state transition to explain the operation (problem) of a conventional muting circuit.

A muting circuit 220 according to an embodiment of the present invention is explained based on FIG. 2 and referring to FIG. 3. FIG. 3 is a schematic illustrating the principal state transition to explain the operation of a muting circuit 220.

The muting circuit 220 according to the present invention is equipped with a DC offset eliminating unit 221, a muting signal generating unit 224, analogue switches SW1, SW2, and a voltage follower 227.

The DC offset eliminating unit 221 is a circuit to eliminate DC offset components included in an AC input signal IN', that are generated due to the internal circuit (e.g., the attenuation amount control unit 210) characteristics of the electronic volume 200 and/or due to the manufacturing variation of ICs, by routing the DC offset components through an HPF (High Pass Filter) constituted by an operational amplifier 222 (a "first operational amplifier" according to the present invention).

In detail, a first feedback resistance R3 is disposed in the negative-feedback path of the operational amplifier 222; a first input resistance R1 and a second input resistance R2 are arranged at the inverting input side and the non-inverting input side of the operational amplifier 222, respectively; the AC input signal IN' is input in common to the inverting input and non-inverting input of the operational amplifier 222 through the first and second input resistances R1 and R2, respectively; and a DC cut capacitor C1 is disposed between the non-inverting input of the operational amplifier 222 and an AC-GND or an analogue GND in parallel with a first ground resistance R4. With this composition, the DC offset eliminating unit 221 constitutes the HPF.

While the DC offset components included in an AC input signal IN', that is generated due to the internal circuit characteristics and/or due to the manufacturing variation of ICs, has been eliminated by the DC offset eliminating unit 221, a DC offset Vy (a "first DC offset" according to the present invention) specific to the operational amplifier 222 will be included in the AC input signal IN' since the operational amplifier 222 is employed in the DC offset eliminating unit 221. This is because an ordinary operational amplifier has a potentiality to generate a slight difference in electric potential between an inverting and a non-inverting input even though its internal circuit is ideally designed. The DC offset Vy specific to the operational amplifier 222 is indicated as the DC voltage of an output voltage Vc referring to an AC-GND level.

A muting signal generating unit 224 is a circuit constituted by an operational amplifier 225 (a "second operational amplifier" according to the present invention) that generates a DC offset Vy' (a "second DC offset" according to the present invention) identical to the level of a DC offset Vy specific to the operational amplifier 222, and outputs a muting signal Vd that indicates the DC offset Vy' by fixing an input to the operational amplifier 225 at the AC-GND level that is common to the operational amplifier 222. The DC offsets Vy and Vy' can be set at an identical level by employing the operational amplifiers 222 and 225 produced from an identical wafer and thus with an identical performance.

Being provided with an identical peripheral circuit with the HPF constituted by the operational amplifier 222, the operational amplifier 225 can set DC offsets Vy and Vy' more accurately at an identical level. Its concrete configuration is as follows: a second feedback resistance R7 identical to the first feedback resistance R3 is disposed in the negative-feedback path of the operational amplifier 225; a third input resistance R5 identical to the first input resistance R1 and a fourth input resistance R6 identical to the second input resistance R2 are arranged on the inverting input side and on the non-inverting input side of the operational amplifier 225, respectively; and the third and fourth input resistances R5 and R6 are connected in common to the AC-GND, that is common to the operational amplifier 222, through a second ground resistance R8 identical to the first ground resistance R4.

A selecting unit 226 is a circuit that receives an AC input signal IN' (hereinafter, referred to as an AC input signal Vc) after DC offset elimination, output by the DC offset eliminating unit 221, and a muting signal Vd output by the muting signal generating unit 224, and then selects the AC input signal Vc to output as an AC output signal OUT in a normal state without muting, or selects the muting signal Vd to output as an AC output signal OUT in a state muting is necessary.

The selecting unit 226 is provided with the analogue switches SW1 and SW2 with identical characteristics, that are complementarily switched on and off by the electronic control by the microcomputer 400, to select and to output an AC input signal Vc or a muting signal Vd.

The analogue switch SW1 is disposed between the output of the operation amplifier 222 and the non-inverting input of the voltage follower 227. In the case that no muting command is given by the microcomputer 400, the analogue switch SW1 is switched on, and an AC input signal Vc is input to the non-inverting input of the voltage follower 227. On the other hand, in the case that a muting command is given by the microcomputer 400, the analogue switch SW1 is switched off, and the input of the AC input signal Vc to the non-inverting input of the voltage follower 227 is shut off.

The analogue switch SW2 is disposed between the output of the operation amplifier 225 and the non-inverting input of the voltage follower 227. In the case that a muting command is given by the microcomputer 400, the analogue switch SW2 is switched on, and a muting signal Vd is input to the non-inverting input of the voltage follower 227. On the other hand, in the case that no muting command is given by the microcomputer 400, the analogue switch SW2 is switched off, and the input of the muting signal Vd to the non-inverting input of the voltage follower 227 is shut off.

In the case that the analogue switch SW1 is on and the analogue switch SW2 is off, a muting process is not executed, and an AC output signal OUT from the muting circuit 220, that is output through the voltage follower 227, is identical to an AC input signal Vc with a DC level of the DC offset level Vy specific to the operational amplifier 222 (sections a and b of FIG. 3).

On the other hand, in the case that the analogue switch SW1 is off and the analogue switch SW2 is on, a muting process is executed, and an AC output signal OUT from the muting circuit 220, that is output through the voltage follower 227, is a muting signal Vd that indicates a DC offset Vy' identical to the level of the DC offset Vy specific to the operational amplifier 222 (sections a and b of FIG. 3).

As the operational amplifiers 222 and 225 are produced from an identical wafer and thus have identical performances, and as their peripheral circuit designs and composing elements are also identical, the DC offsets Vy and Vy' can be regarded as virtually identical. Therefore, as the level of the AC output signal OUT from the muting circuit 220 can be regarded to be constant without fluctuations (section c of FIG. 3) at the timing of the switching over of the analogue switches SW1 and SW2 between on and off, i.e., at the timing of the start or the end of muting, it is possible to reduce not only noises out of the audible frequency range, as has been done, but also those within the audible frequency range.

The above embodiments of the present invention are simply for facilitating the understanding of the present invention and are not in any way to be construed as limiting the present invention. The present invention may variously be changed or altered without departing from its spirit and encompass equivalents thereof.

It is claimed:

1. A muting circuit comprising:
   a DC offset eliminating unit including an HPF (High Pass Filter) constituted by a first operational amplifier, the DC offset eliminating unit configured to output an output signal obtained by eliminating a DC offset component of an AC input signal, the output signal having a first DC offset level introduced by the first operational amplifier;
   a muting signal generating unit configured to generate a muting signal having a DC level identical to the first DC offset level, the muting signal generating unit including a second operational amplifier having inputs fixed at a predetermined DC level; and
   a selecting unit configured to select and output the output signal when muting is not executed, and to select and output the muting signal when muting is executed.

2. The muting circuit of claim 1, wherein
   the first operational amplifier and the second operational amplifier are made from an identical wafer to have an identical performance.

3. The muting circuit of claim 1, wherein
   the DC offset eliminating unit further includes:
      a first feedback resistance disposed on a negative-feedback path of the first operational amplifier;
      a first input resistance and a second input resistance disposed respectively on an inverting input side and a non-inverting input side of the first operational amplifier, the AC input signal being input in common to an inverting input and a non-inverting input of the first operational amplifier through the first input resistance and the second input resistance, respectively; and
      a first ground resistance and a DC cut capacitor disposed in parallel between the non-inverting input of the first operational amplifier and a ground,
   so as to constitute the HPF, and wherein
   the muting signal generating unit further includes:
      a second feedback resistance identical to the first feedback resistance, disposed on a negative-feedback path of the second operational amplifier; and
      a third input resistance and a fourth input resistance identical respectively to the first input resistance and the second input resistance, disposed respectively on an inverting input side and a non-inverting input side of the second operational amplifier,
      the third input resistance and the fourth input resistance being connected to the ground in common through a second ground resistance identical to the first ground resistance.

4. The muting circuit of claim 1, wherein the selecting unit further includes:
   a first analogue switch configured to select and output an AC input signal output from the DC offset eliminating unit; and
   a second analogue switch identical in characteristics to the first analogue switch, the second analogue switch being configured to select and output a muting signal output from the muting signal generating unit.

* * * * *